US 11,357,151 B2

(12) United States Patent
Ito et al.

(10) Patent No.: US 11,357,151 B2
(45) Date of Patent: Jun. 7, 2022

(54) COMPONENT MOUNTING MACHINE

(71) Applicant: FUJI CORPORATION, Chiryu (JP)

(72) Inventors: Taro Ito, Toyokawa (JP); Akira Hara, Toyohashi (JP); Nguyen Hieu Nghia, Funabashi (JP)

(73) Assignee: FUJI CORPORATION, Chiryu (JP)

( * ) Notice: Subject to any disclaimer, the term of this patent is extended or adjusted under 35 U.S.C. 154(b) by 151 days.

(21) Appl. No.: 16/614,492

(22) PCT Filed: Jun. 7, 2017

(86) PCT No.: PCT/JP2017/021061
§ 371 (c)(1),
(2) Date: Nov. 18, 2019

(87) PCT Pub. No.: WO2018/225170
PCT Pub. Date: Dec. 13, 2018

(65) Prior Publication Data
US 2020/0077553 A1    Mar. 5, 2020

(51) Int. Cl.
*H05K 13/08* (2006.01)
*H05K 13/04* (2006.01)

(52) U.S. Cl.
CPC ....... *H05K 13/0882* (2018.08); *H05K 13/046* (2013.01); *H05K 13/0419* (2018.08); *H05K 13/0486* (2013.01)

(58) Field of Classification Search
CPC ............ H05K 13/0882; H05K 13/086; H05K 13/087; H05K 13/089; H05K 13/0419; H05K 13/046; H05K 13/0486
See application file for complete search history.

(56) References Cited

U.S. PATENT DOCUMENTS

| 4,610,083 A | * | 9/1986 | Campisi | ............. H05K 13/0452 29/832 |
| 5,224,325 A | * | 7/1993 | Takahashi | ............... B65B 15/04 53/443 |

(Continued)

FOREIGN PATENT DOCUMENTS

| EP | 1 174 013 | 1/2002 |
| EP | 1 566 875 A1 | 8/2005 |

(Continued)

OTHER PUBLICATIONS

Extended European Search Report dated Apr. 5, 2020 in corresponding European Patent Application No. 17912839.2, 8 pages.

(Continued)

*Primary Examiner* — Jeffrey T Carley
(74) *Attorney, Agent, or Firm* — Oblon, McClelland, Maier & Neustadt, L.L.P.

(57) ABSTRACT

A component mounting machine performs a mounting operation of mounting an electronic component to a board. The component mounting machine includes: multiple related operation devices each including an electrically-operated section configured to perform a related operation that is an operation related to the mounting operation, and an output section configured to output an operation signal representing a state of the electrically-operated section that is operating; and circuitry configured to limit the quantity of the related operation devices for which the electrically-operated section is in an operating state to a specified quantity or fewer based on whether there is presence of the operation signal of the multiple related operation devices.

6 Claims, 5 Drawing Sheets

(56) References Cited

U.S. PATENT DOCUMENTS

| | | | | |
|---|---|---|---|---|
| 6,009,352 A * | 12/1999 | Suzuki | ................. | H05K 13/085 |
| | | | | 700/108 |
| 6,701,611 B1 * | 3/2004 | Izumida | ............. | H05K 13/0885 |
| | | | | 29/832 |
| 6,996,440 B2 * | 2/2006 | Maenishi | ........... | H05K 13/0452 |
| | | | | 700/28 |
| 8,612,041 B2 * | 12/2013 | Shim | .................. | H05K 13/0853 |
| | | | | 700/100 |
| 10,466,683 B2 * | 11/2019 | Ishimoto | ............ | H05K 13/0417 |
| 10,874,041 B2 * | 12/2020 | Matsuyama | ........... | H05K 13/02 |
| 2017/0127526 A1 * | 5/2017 | Imasu | .................. | G05B 19/418 |

FOREIGN PATENT DOCUMENTS

| | | |
|---|---|---|
| JP | 2000-307297 A | 11/2000 |
| JP | 2010-45295 A | 2/2010 |
| WO | WO 2017/090192 A1 | 6/2017 |

OTHER PUBLICATIONS

International Search Report dated Aug. 15, 2017 in PCT/JP2017/021061 filed on Jun. 7, 2017.

* cited by examiner

| Cy | 1 | → | 2 | → | 3 | → | 4 | 5 | 6 | 7 | 8 | → | 9 | → | 10 | 11 | → |
|---|---|---|---|---|---|---|---|---|---|---|---|---|---|---|---|---|---|
| F1 | | | | | × | | × | × | × | | | | × | | × | × | |
| F2 | | | | | × | | × | × | × | × | | | × | | × | × | |
| F3 | | | | | ○ | | ○ | ○ | ○ | ○ | ○ | | ○ | | ○ | ○ | |
| F4 | ○ | | ○ | | ○ | | | | | | | | × | | × | × | |
| F5 | | | ○ | | ○ | | ○ | ○ | ○ | ○ | ○ | | ○ | | | × | |
| F6 | | | | | × | | | | | | | | ○ | | ○ | ○ | |
| F7 | | | | | × | | × | | | | | | × | | | ○ | |
| F8 | | | | | × | | × | × | | | | | × | | × | × | |

FIG. 5

| Cy | 1 | → | 2 | → | 3 | → | 4 | 5 | 6 | 7 | 8 |
|---|---|---|---|---|---|---|---|---|---|---|---|
| F1 |   |   |   |   | × |   | × | × | × |   |   |
| F2 |   |   |   |   | × |   | × | × | × | × |   |
| F3 |   |   |   |   | ○ |   | ○ | ○ | ○ | ○ | ○ |
| F4 | ○ |   | ○ |   | ○ |   |   |   |   |   |   |
| F5 |   |   | ○ |   | ○ |   | ○ | ○ | ○ | ○ | ○ |
| F6 |   |   |   |   | × |   | × | × |   |   |   |
| F7 |   |   |   |   | × |   | × |   |   |   |   |
| F8 |   |   |   |   | × |   |   |   |   |   |   |

FIG. 6

| Cy | 1 | → | 2 | → | 3 | → | 4 | 5 | → | 13 | → | 14 | 15 | 16 |
|---|---|---|---|---|---|---|---|---|---|---|---|---|---|---|
| F1 |   |   |   |   | × |   | × | × |   | × |   | × | × | × |
| F2 |   |   |   |   | × |   | × | × |   | × |   | × | × | × |
| F3 |   |   |   |   | ○ |   | ○ | ○ |   | ○ |   | ○ | ○ | ○ |
| F4 | ○ |   | ○ |   | ○ |   |   |   |   | ○ |   |   |   |   |
| F5 |   |   | ○ |   | ○ |   | ○ | ○ |   | ○ |   | ○ | ○ | ○ |
| F6 |   |   |   |   | × |   |   |   |   | × |   | × | × |   |
| F7 |   |   |   |   | × |   | × |   |   | × |   |   |   |   |
| F8 |   |   |   |   | × |   | × | × |   | × |   | × |   |   |

FIG. 7

COMPONENT MOUNTING MACHINE

TECHNICAL FIELD

The present disclosure relates to a component mounting machine for performing a mounting operation for mounting an electronic component (also referred to as component) to a board.

BACKGROUND ART

Technology for mass production of circuit boards by performing various operations (hereinafter referred to as board operations) for mounting components on a board on which printed wiring has been applied has become widespread. A typical example of a board working machine for performing work on a board includes a component mounting machine for performing work for mounting a component. Component mounting machines generally include: a board conveyance device; component supply devices; and a component transfer device. As a component supply device, a configuration in which feeder devices are arranged in rows in multiple slots provided on a feeder pallet is commonly used. A feeder device may be referred to as a related operation device that performs a component supply operation as an operation related to a mounting operation. Technology related to such a type of component supply device is disclosed in patent literature 1.

Patent literature 1 discloses technology of a control method for aligning origin positions of feeder devices at a component mounting machine. In this control method, multiple feeder devices are divided into multiple groups within a range such that each feeder can be simultaneously supplied with electric power, an order of performing the origin alignment for the feeder devices is determined for each of the divided groups, and origin alignment is performed for multiple groups at the same time. As a result, the required maximum power can be reduced as compared with a conventional method in which the origin alignment is performed simultaneously for all the feeder devices.

CITATION LIST

Patent Literature

Patent Literature 1: JP-A-2010-45295

BRIEF SUMMARY

Technical Problem

Note that, with patent literature 1, the number of feeder devices that operate simultaneously is limited, thereby reducing the required maximum power and reducing the cost of the power source device. However, limiting a number of operating devices is not restricted to aligning the origin position during changeover, it is also indispensable when the component mounting machine is performing mounting operation. For example, when components are collected from multiple feeder devices using a rotary tool having multiple suction nozzles, multiple feeder devices must each perform a feeding operation of carrier tape holding the components. Further, when feeder devices run out of components, the end of new carrier tape is taken up automatically or based on a manual command. This taking up operation may overlap with a feeding operation of other feeder devices.

Feeder devices that operate while mounting operation is being performed change over time depending on the progress of mounting work or the component consumption state. Therefore, the order of operations of feeder devices cannot be determined in advance as described in patent literature 1. That is, if the autonomous operation of respective feeder devices is allowed, the number of operating devices cannot be reliably limited. Note that, with a component supply device, related operation devices other than feeder devices may be arranged in a row in the feeder pallet. Common to various related operation devices are the above-mentioned points that the order of operations cannot be determined in advance, and the quantity of operating devices cannot be limited.

An object of the present disclosure is to provide a component mounting machine capable of appropriately operating multiple related operation devices while reducing the required maximum power while performing mounting operation.

Solution to Problem

Disclosed herein is a component mounting machine configured to perform a mounting operation of mounting an electronic component to a board, the component mounting machine including: multiple related operation devices each including an electrically-operated section configured to perform a related operation that is an operation related to the mounting operation, and an output section configured to output an operation signal representing a state of the electrically-operated sections that is operating; and a limiting device configured to limit the quantity of the related operation devices for which the electrically-operated section is in an operating state to a specified quantity or fewer based on whether there is presence of the operation signal of the multiple related operation devices.

Advantageous Effects

According to the component mounting machine of the present disclosure, an output section of a related operation device is configured to output an operation signal representing an operating state and a limiting device is configured to limit the quantity of the related operation devices to a specified quantity or fewer based on the presence or absence of the operation signal of the multiple related operation devices. Therefore, even if the order of operation of the related operation devices is not determined in advance, the quantity of related operation devices that are operating can be limited to reduce the required maximum power when mounting operation is performed. In addition, multiple related operation devices can be appropriately operated within a range of a specified quantity.

DESCRIPTION OF EMBODIMENTS

1. Configuration of Component Mounting Machine 1 of the First Embodiment

Figure 1:
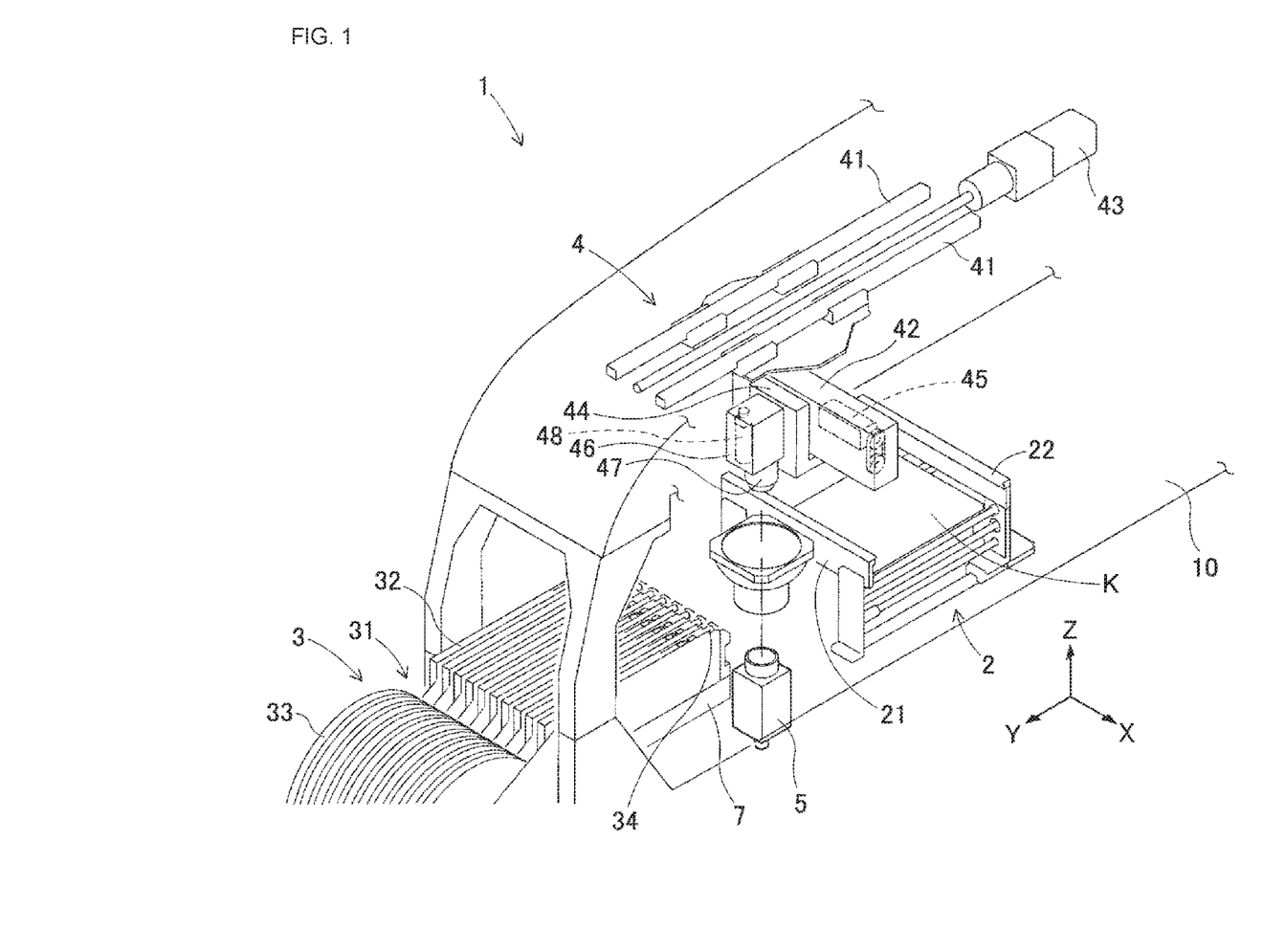
FIG. 1 is a perspective view showing a configuration of a main portion of a component mounting machine according to a first embodiment.

Component mounting machine 1 of a first embodiment will be described with reference to FIGS. 1 to 4. FIG. 1 is a perspective view showing a configuration of a main portion of component mounting machine 1 according to a first embodiment.

The direction from the upper left to the lower right in FIG. 1 is the X-axis direction in which board K is conveyed, and the direction from the upper right to the lower left is the Y-axis direction which is the front-rear direction of component mounter 1. Component mounter 1 includes items such as board conveyance device 2, component supply device 3, component transfer device 4, component camera 5, mounting control section 6 (refer to FIG. 2), and machine base 10.

Board conveyance device 2 includes first guide rail 21 and second guide rail 22, a pair of conveyor belts, a clamp device, and the like. First guide rail 21 and second guide rail 22 are mounted on machine base 10 parallel to each other so as to extend in the X-direction across the upper center of machine base 10. A pair of conveyor belts arranged in parallel to each other are arranged directly below first guide rail 21 and second guide rail 22. The pair of conveyor belts revolve with board K in contact with the conveyance surface of the conveyor belts to load and unload board K to and from a mounting position set in a center section of machine base 10. Further, a clamp device is provided below the conveyor belts in the central portion of machine base 10. The clamp device pushes up board K with multiple pusher pins and clamps it horizontally to position it in the mounting position.

Component supply device 3 is detachably mounted on the front side of component mounter 1. Component supply device 3 includes device pallet 7 and multiple feeder devices 31. Device pallet 7 is a thin rectangular box-like member. Power source device 71 and limiting device 75 are arranged in an interior space of device pallet 7 (refer to FIG. 2). Multiple slots extending in the Y axis direction are provided in parallel on the upper surface of device pallet 7. The multiple feeder devices 31 are detachably inserted into and attached to respective slots.

Feeder device 31 includes: main body 32; supply reel 33 provided on the front side of main body 32; and component removal section 34 provided on an upper rear portion of main body 32. Carrier tape in which many components are sealed at a predetermined pitch is wound and held on supply reel 33. When the carrier tape is fed out at predetermined pitches, components are exposed from the encapsulated state and sequentially fed to component removal section 34. Feeder device 31 is a related operation device that performs a component supply operation as an operation related to a mounting operation.

Component transfer device 4 includes items such as pair of Y-axis rails 41, Y-axis moving table 42, Y-axis motor 43, X-axis moving table 44, X-axis motor 45, mounting head 46, rotary tool 47, and Z-axis motor 48. The pair of Y-axis rails 41 is provided above the region from the rear section of machine base 10 to component supply device 3 at the front. Y-axis moving table 42 is loaded on pair of Y-axis rails 41. Y-axis moving table 42 is moved in the Y-axis direction by the driving of Y-axis motor 43 via a ball screw mechanism. X-axis moving table 44 is loaded on Y-axis moving table 42. X-axis moving table 44 is moved in the X-axis direction by the driving of X-axis motor 45 via a ball screw mechanism.

Mounting head 46 is arranged on the front side of X-axis moving table 44. Mounting head 46 has rotary tool 47 on a lower side. Although omitted from FIG. 1, multiple suction nozzles are arranged in a ring on the lower side of rotary tool 47. The multiple suction nozzles are rotated at the lower side of rotary tool 47 to select one. The selected suction nozzle is raised and lowered by the driving of Z-axis motor 48. Further, the suction nozzle picks up a component by being supplied with negative pressure, and mounts the component on board K by being supplied with positive pressure. Mounting head 46 may include, but is not limited to, a clamping attachment for clamping a component.

Component transfer device 4 proceeds with mounting operations by repeating the pickup and mounting cycle. In detail, mounting head 46 of component transfer device 4 moves to component supply device 3 and picks up components with multiple suction nozzles. Next, upon mounting head 46 moving to component camera 5, the pickup states of the multiple components are imaged. Next, mounting head 46 moves to board K to mount the components, then returns to component supply device 3.

Component camera 5 is provided facing upwards on an upper surface of machine base 10 between board conveyance device 2 and component supply device 3. Component camera 5 captures an image of a state in which the multiple suction nozzles of mounting head 46 are moving to board K having picked up components from component removal section 34. As a result, component camera 5 can collectively image the components held by the multiple suction nozzles. The acquired image data is image processed, and the pickup state of the components is checked. When the pickup position of the component, deviation of the rotation angle, bending of leads, and the like have been checked, the mounting operation is finely adjusted as necessary. Components that are difficult to mount are discarded.

Mounting control section 6 holds job data for each board type and controls mounting operation. The job data is data describing a detailed procedure and method for mounting operation. Mounting control section 6 transmits various commands to board conveyance device 2, component supply device 3, component transfer device 4, and component camera 5. Mounting control section 6 also receives information related to operating states from these devices (2-5).

Figure 2:
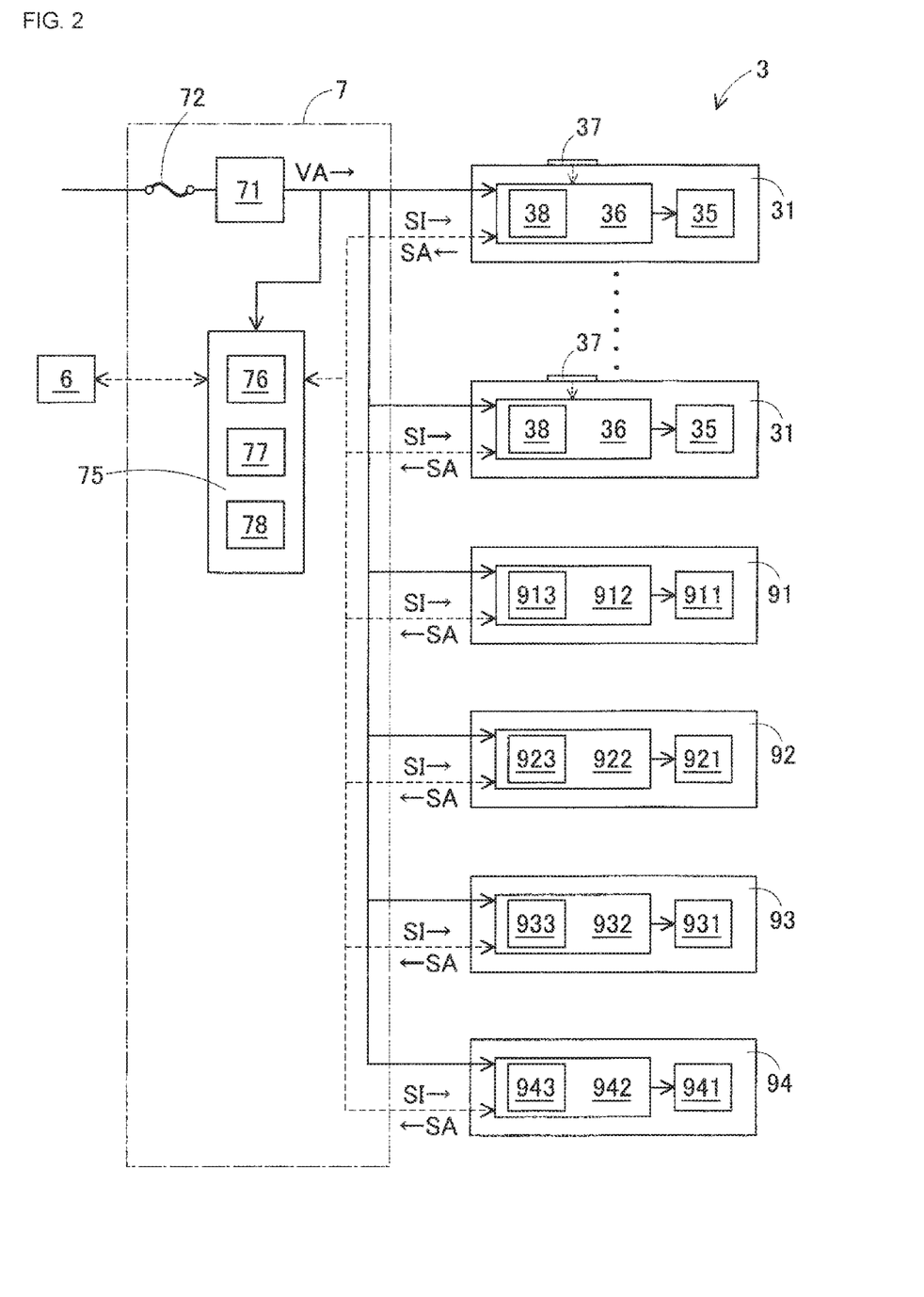
FIG. 2 is a block diagram schematically showing a configuration related to power supply and control of a component supply device.

FIG. 2 is a block diagram schematically showing a configuration related to power supply and control of component supply device 3. In FIG. 2, the supply route of the power source is indicated by a solid line, and the flow of control signals is indicated by a broken line. Power source device 71 arranged in the interior space of device pallet 7 is connected to a main power supply, which is not shown, via protective fuses 72. Power source device 71 transforms the power supply voltage of mains power supply to generate an operating voltage VA and supplies power to multiple related operation devices including feeder device 31 and limiting device 75. Power source device 71 serves as both a control power supply and a drive power supply.

Feeder device 31 includes electrically-operated section 35, feeder control section 36, and operation panel 37. When feeder device 31 is inserted and attached to a slot of feeder pallet 7, feeder control section 36 is automatically connected to power source device 71 and limiting device 75. Electrically-operated section 35 drives the above-mentioned carrier tape feeding operation and taking up operation. A stepping motor is an example of electrically-operated section 35. Feeder control section 36 operates electrically-operated section 35 in accordance with an operation request. Operation requests include a tape feeding command from mounting control section 6, an operation command from operation panel 37, and the like.

In detail, whenever a component is picked up from a feeder device 31 by a suction nozzle of mounting head 46, it is necessary to perform a feeding operation of the carrier tape. Thus, mounting control section 6 transmits a tape feeding command via a command route, which is not shown, to feeder control section 36 of that feeder device 31. Upon receiving the tape feeding command, feeder control section 36 supplies power to electrically-operated section 35 to enable operation and feeds the carrier tape by a predetermined pitch.

Also, whenever components run out at a feeder device 31, an operator inserts the end of a new carrier tape into the feeder device 31 and inputs an operation command via operation panel 37. Upon receiving the operation command, feeder control section 36 supplies power to electrically-operated section 35 to enable operation and takes up the end of the carrier tape to component removal section 34. In the present disclosure, a state in which feeder control section 36 is functioning and electrically-operated section 35 is operating is referred to as an operating state, and a state in which feeder control section 36 is functioning but electrically-operated section 35 is not operating is referred to as a stopped state.

Feeder control section 36 includes output section 38 configured to output operation signal SA representing an operation state to limiting device 75. Operation signal SA is output only during operating time. Operation signal SA may be a signal that differs between the feeding operation and the take-up operation of the carrier tape, or may be the same signal SA. Further, feeder control section 36 does not allow electrically-operated section 35 to operate while receiving interlock signal SI from limiting device 75. A non-voltage contact point is an example of a specification for transmitting operation signal SA and interlock signal SI, but the configuration is not limited to this.

Related operation devices other than feeder device 31 may also be attached to slots of device pallet 7. Examples of related operation devices include tray type pallet device 91, dicing sheet type pallet device 92, dip device 93, and defective component collection device 94. Operation content of these related operation devices differs. However, configurations related to power supply and control of these related operation devices is similar to feeder device 31, as described below. Further, the operating state and the stopped state of these related operation devices is similar to feeder device 31.

Tray type pallet device 91 supplies components using a pallet on which is loaded a tray that holds multiple components. Tray type pallet device 91 includes electrically-operated section 911 and tray control section 912. Tray type pallet device 91 is attached across multiple slots of device pallet 7. When attached, tray control section 912 is automatically connected to power source device 71 and limiting section 75.

Electrically-operated section 911 drive tray exchange operation and the like. Tray control section 912 controls operation of electrically-operated section 911 in accordance with operation requests from mounting control section 6. Tray control section 912 includes output section 913 configured to output operation signal SA representing an operating state in which electrically-operated section 911 is operating to limiting device 75. Further, tray control section 912 does not allow electrically-operated section 911 to operate while receiving interlock signal SI from limiting device 75.

Dicing sheet type pallet device 92 supplies die components using a pallet on which a dicing sheet that holds multiple components is stretched. Dicing sheet type pallet device 92 includes electrically-operated section 921 and sheet control section 922. Dicing sheet type pallet device 92 is attached across multiple slots of device pallet 7. When attached, sheet control section 922 is automatically connected to power source device 71 and limiting device 75.

Electrically-operated section 921 performs a pushup operation of the dicing sheet and the like such that the die components can be picked up. Sheet control section 922 controls operation of electrically-operated section 921 in accordance with operation requests from mounting control section 6. Sheet control section 922 includes output section 923 configured to output operation signal SA representing an operating state in which electrically-operated section 921 is operating to limiting device 75. Sheet control section 922 does not allow electrically-operated section 921 to operate while receiving interlock signal SI from limiting device 75.

Dip device 93 performs a supply operation of a bonding material such as an adhesive or solder paste. Dip device 92 includes electrically-operated section 931 and dip control section 932. Dip device 93 is inserted into and attached to slots of device pallet 7. When attached, dip control section 932 is automatically connected to power source device 71 and limiting device 75.

Electrically-operated section 931 drives an operation of dispensing a bonding material or solder paste from a storage container. Dip control section 932 controls operation of electrically-operated section 931 in accordance with operation requests from mounting control section 6. Dip control section 912 includes output section 933 configured to output operation signal SA representing an operating state in which electrically-operated section 931 is operating to limiting device 75. Dip control section 932 does not allow electrically-operated section 931 to operate while receiving interlock signal SI from limiting device 75.

Defective component collection device 94 performs a collection operation of a component determined to be defective by imaging of camera device 5. Defective component collection device 94 includes electrically-operated section 941 and conveyor control section 942. Defective component collection device 94 is inserted into and attached to slots of device pallet 7. When attached, conveyor control section 942 is automatically connected to power source device 71 and limiting device 75.

Electrically-operated section 941 drives a component collection operation by revolving the conveyor. Conveyor control section 942 controls operation of electrically-operated section 941 in accordance with operation requests from mounting control section 6. Conveyor control section 942 includes output section 943 configured to output operation signal SA representing an operating state in which electrically-operated section 941 is operating to limiting device 75. Conveyor control section 942 does not allow electrically-operated section 941 to operate while receiving interlock signal SI from limiting device 75.

FIG. 2 shows two feeder devices 31 and one each of other types of related operation devices (91, 92, 93, 94). In practice, it is hardly ever the case that all types of related operation devices (31, 91, 92, 93, 94) are lined up in a row on device pallet 7. However, power source device 71 and limiting device 75 are able to handle all the related operation devices (31, 91, 92, 93, 94) attached to device pallet 7 in parallel. All the related operation devices (31, 91, 92, 93, 94) are identified by slot numbers associated with each slot on device pallet 7.

Here, power source device 71 has a limited power supply capacity in order to make it more compact and to reduce costs. That is, power source device 71, in addition to limiting device 75, is able to supply electric power to control sections (36, 912, 922, 932, 942) of all the related operation devices (31, 91, 92, 93, 94). However, the number of electrically-operated sections (35, 911, 921, 931, 941) that can be supplied with power from power source device 71 is limited to an allowable specified quantity or fewer. If the quantity of electrically-operated sections (35, 911, 921, 931, 941) that are operating exceeds the specified quantity, power source device 71 will become overloaded, and the risk of blowing protective fuse 72 will be increased. If protective fuse 72 blows, component supply device 3 will lose functionality, component mounting machine 1 will stop production, resulting in a large loss.

To prevent power source device 71 becoming overloaded, limiting device 75 is provided. Limiting device 75 is configured using a computer device. Limiting device 75 is connected to all the control sections (36, 912, 922, 932, 942) associated with the slot numbers of device pallet 7. Limiting device 75 has a function of individually receiving operation signals SA outputted from the respective control sections (36, 912, 922, 932, 942). Further, limiting device 75 has a function of individually outputting interlock signals SI to the respective control sections (36, 912, 922, 932, 942).

Limiting device 75 is also connected to mounting control section 6. Limiting device 75 acquires information on the order in which multiple related operation devices operate from mounting control section 6. Limiting device 75 includes an interlock transition section unit 76, interlock output section 77, and interlock release section 78 as functional units for controlling the operation of the related operation devices.

Interlock transition section unit 76 allows one of the related operation devices in the stopped state to transition to the operating state when the signal quantity of operating signals SA is fewer than the specified quantity. When the signal quantity of operation signals SA reaches the specified quantity, interlock output section 77 outputs interlock signal SI to the related operation devices in the stopped state to prohibit the operation devices from transitioning to the operating state. When the signal quantity of operation signals SA decreases from the specified quantity, interlock release section 78 cancels a portion of the interlock signals SI being output, and allows one of the related operation devices in the stopped state to transition to the operating state (that is, releases the interlock).

2. Operation and Effects of Component Mounting Machine 1 of the First Embodiment Next, the operation and effects of component mounting machine 1 of the first embodiment will be described mainly with reference to control operations of limiting device 75.

Figure 3:
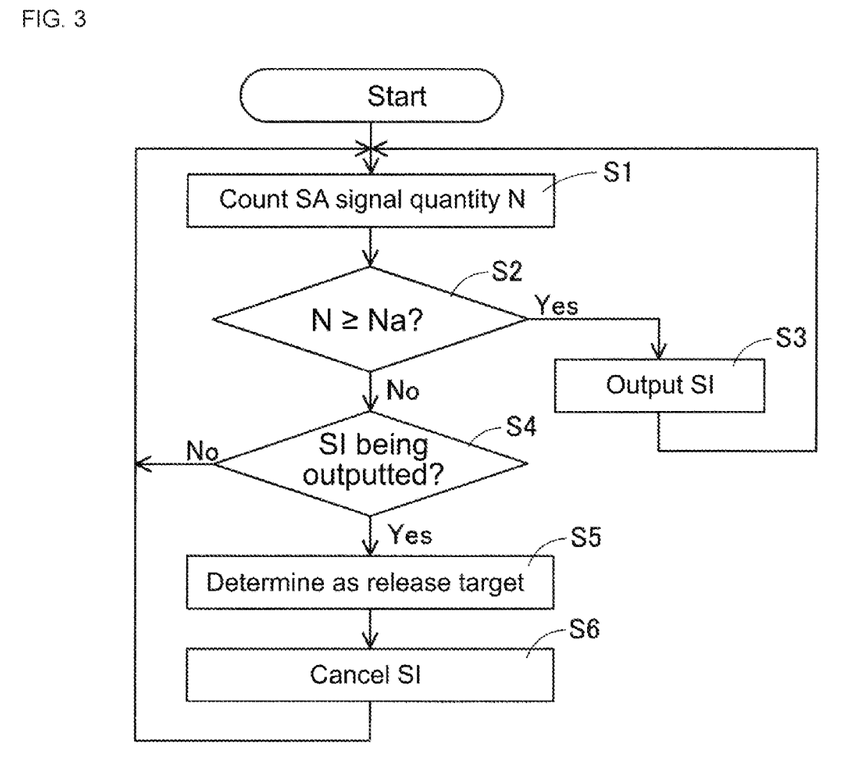
FIG. 3 is a flow chart showing a control flow of the limiting device in the component mounting machine of the first embodiment.

FIG. 3 is a flow chart showing a control flow of limiting device 75 in component mounting machine 1 of the first embodiment. Limiting device 75 repeatedly executes the control cycle of the control flow shown in FIG. 3.

In step S1 of FIG. 3, limiting device 75 counts signal quantity N of the operating signals SA being output from all the related operation devices (31, 91, 92, 93, 94) on device pallet 7. Signal quantity N naturally corresponds to the quantity of related operation devices in the operating state. In step S2, limiting device 75 proceeds to step S3 of the control flow if the signal quantity N is equal to or greater than allowable specified quantity Na, and proceeds to step S4 of the control flow if the signal quantity N is not equal to or greater than allowable specified quantity Na.

In step S3, interlock output section 77 of limiting device 75 outputs interlock signal SI to related operation devices in the stopped states. Related operation devices receiving the interlock signal SI do not transition to the operating state regardless of the presence of an operation request. Thus, the quantity of related operation devices in the operating state will not increase. Thus, overloading of power source device 71 is curtailed.

When signal quantity N exceeds the specified quantity Na, it is preferable that interlock output section 77 outputs the interlock signal SI to the excess quantity of related operation devices that are in the operating state. This causes the related operation devices that are in the operating state and that have received the interlock signal SI to interrupt the related operation. Thus, the quantity of related operation devices that are in the operating state is reduced to the specified quantity Na, and overloading of power source device 71 is eliminated. By performing step S3, one control cycle is completed. Interlock output section 77 returns the execution of the control flow to step S1.

When the signal quantity N is fewer than the specified quantity Na in step S4, limiting device 75 determines whether the interlock signal SI is being output to determine which branch of the control flow to proceed to. If the interlock signal SI is not being output, interlock transition section 76 of limiting device 75 returns the execution of the control flow to step S1 without performing anything. Accordingly, the related operation devices in the stopped state can transition from the stopped state to the operating state if an operation request is generated. This completes one control cycle.

If the interlock signal SI is being output in step S5, interlock release section 78 of limiting device 75 determines a release target for canceling the interlock signal SI. In the first embodiment, interlock release section 78 acquires information on the order in which the related operation devices operate from mounting control section 6, and determines an interlock releasing target according to this order. In step S6, interlock release section 78 cancels the interlock signal SI being output to the release target. When an operation request is generated, the release target related operation device can transition from the stopped state to the operating state. By performing step S6, one control cycle is completed. Interlock release section 78 returns the execution of the control flow to step S1.

Figure 4:
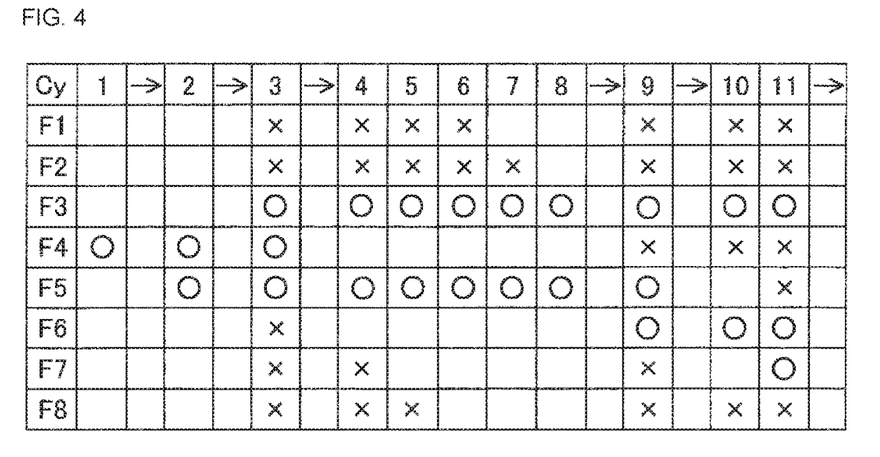
FIG. 4 is a diagram of a first example illustrating how control operation of the limiting device proceeds.

Next, the above-described operation will be described in detail by presenting a specific example. Specifically, it is assumed that eight feeder devices 31 are arranged in a row from slot number 1 to slot number 8 of device pallet 7. Hereinafter, the eight feeder devices 31 are referred to as first feeder F1 to eighth feeder F8. The allowable specified quantity Na is three. FIG. 4 is a diagram of a first example illustrating how control operation of limiting device 75 proceeds. The first column of FIG. 4 represents the elapse of the control cycle Cy from left to right, and the second to ninth columns represent the states of the first feeder F1 to the eighth feeder F8 in the control cycle Cy. A blank in each column represents a stopped state, a circle represents an operating state, and an X represents a stopped state while receiving interlock signal SI.

In first control cycle Cy1 of FIG. 4, fourth feeder F4 is in an operating state. The other feeders, first feeder F1, second feeder F2, third feeder F3, fifth feeder F5, sixth feeder F6, seventh feeder F7, and eighth feeder F8 are in a stopped state. Here, signal quantity N is one. Next, in second control cycle Cy2, fifth feeder F5 transitions from the stopped state to the operating state. Here, signal quantity N increases from one to two. Next, in third control cycle Cy3, third feeder F3 transitions from the stopped state to the operating state. Here, signal quantity N increases from two to three.

Until just before the period from first control cycle Cy1 to third control cycle Cy3, signal quantity N was fewer than the specified quantity Na (which is equal to three). Therefore, interlock transition section 76 repeatedly executes the loop formed by the steps S1, S2, and S4. In third control cycle Cy3, signal quantity N matches the specified quantity Na, so interlock output section 77 executes step S3. That is, interlock output section 77 outputs interlock signals SI to first feeder F1, second feeder F2, sixth feeder F6, seventh feeder F7, and eighth feeder F8, which are in the stopped state.

Next, in fourth control cycle Cy4, fourth feeder F4 completes related operation and transitions to the stopped state. Here, signal quantity N is reduced from three to two, so interlock release section 78 executes steps S5 and S6. In step S5, interlock release section 78 acquires information on the order of subsequent operations from mounting control section 6. Here, the order is: sixth feeder F6, seventh feeder F7, eighth feeder F8. Interlock release section 78 sets sixth feeder F6 as a release target based on the acquired order. In step S6, interlock release section 78 cancels the interlock signal SI being output to sixth feeder F6.

If sixth feeder F6 does not immediately transition into the operating state, interlock release section 78 operates again in the subsequent fifth control cycle Cy5. That is, interlock release section 78 sets seventh feeder F7 as the next release target based on the acquired order, and cancels the interlock signal SI. Further, in the subsequent sixth control cycle Cy6, interlock release section 78 operates again. That is, interlock release section 78 sets eighth feeder F8 as the next release target based on the acquired order, and cancels the interlock signal SI.

Further, in seventh control cycle Cy7, interlock release section 78 sets first feeder F1, which is not in the acquired order, as the next release target, and releases the interlock signal SI. Next, in eighth control cycle Cy8, interlock release section 78 sets second feeder F2, which is not in the acquired order, as the next release target, and releases the interlock signal SI. At the time of eighth control cycle Cy8, the signal quantity N is two, and all the interlock signals SI have been released.

Next, in ninth control cycle Cy9, sixth feeder F6 transitions from the stopped state to the operating state. Here, signal quantity N increases from two to three. That is, interlock output section 77 outputs interlock signals SI to first feeder F1, second feeder F2, fourth feeder F4, seventh feeder F7, and eighth feeder F8, which are in the stopped state.

Next, in tenth control cycle Cy10, fifth feeder F5 completes related operation and transitions to the stopped state. Here, signal quantity N decreases from two to three. Accordingly, interlock release section 78 sets seventh feeder F7 as the next release target based on the acquired order, and cancels the interlock signal SI.

If seventh feeder F7 immediately transitions into the operating state, interlock output section 77 operates again in the subsequent eleventh control cycle Cy11. That is, interlock output section 78 outputs the interlock signal SI to fifth feeder F5 immediately after the transition to the stopped state. In addition, interlock output section 78 continues outputting the interlock signals SI to first feeder F1, the second feeder F2, the fourth feeder F4, and the eighth feeder F8.

Note that, first feeder F1 and second feeder F2, which are not included in the order of operating acquired from mounting control section 6, are not used for the current board type being produced. Nevertheless, operation requests from operation panel 37 may occur during changeover work for the next board to be produced. Therefore, it is desirable that interlock release section 78 lowers the priority of setting first feeder F1 and second feeder F2 as release targets.

Also, as mounting work of component mounting machine 1 proceeds, components may run out at any of the feeders from third feeder F3 to eighth feeder F8. In this case, an operation request is generated from operation panel 37. If third feeder F3 to eighth feeder F8 are not interlocked, they immediately transition to the operating state. Further, even if third feeder F3 to eighth feeder F8 are being interlocked, the interlock signals SI are canceled according to the order and transitioning to the operating state becomes possible.

According to component mounting machine 1 of the first embodiment, limiting device 75 limits the signal quantity N of operating signals SA of the multiple related operation devices (31, 91, 92, 93, 94) to the specified quantity Na or fewer. Therefore, even if the order of operating of the related operation devices (31, 91, 92, 93, 94) is not determined in advance, it is possible to reduce the necessary maximum power by limiting the operating quantity N of the related operation devices (31, 91, 92, 93, 94) while mounting operations are being performed. In addition, multiple related operation devices (31, 91, 92, 93, 94) can be appropriately operated within a range of the specified quantity Na.

3. Alternative Forms of the First Embodiment

Next, alternative forms of the first embodiment will be described mainly with reference to altered portions. In a first alternative embodiment, without changing the configuration shown in FIG. 1, limiting device 75 of the configuration shown in FIG. 2 is not connected to mounting control section 6. Limiting device 75 executes the control flow shown in FIG. 3. However, in step S5, the method of determining the release target by interlock release section 78 is modified.

Figure 5:
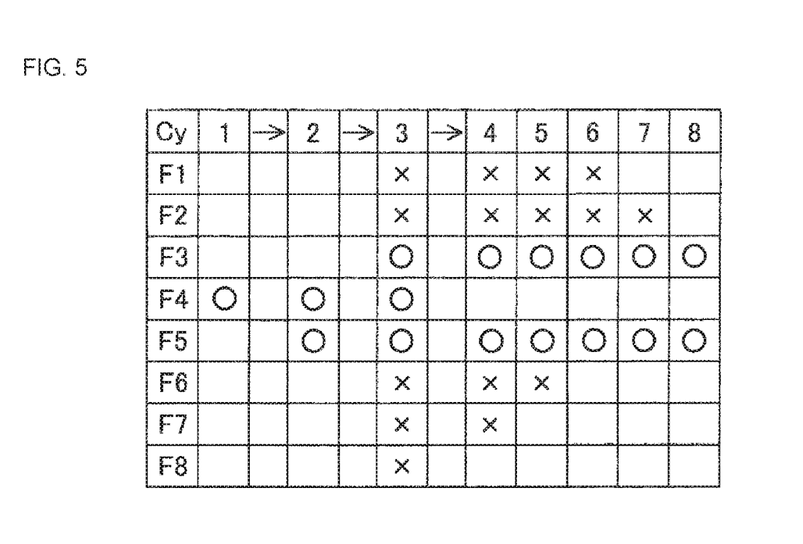
FIG. 5 is a diagram of a second example illustrating how control operation of the limiting device proceeds in an alternative embodiment.

FIG. 5 is a diagram of a second example illustrating how control operation of limiting device 75 proceeds in a first alternative embodiment. The reference characters in FIG. 5 are the same as in FIG. 4. Also, events from first control cycle Cy1 to third control cycle Cy3 in FIG. 5 are the same as those in FIG. 4. In fourth control cycle Cy4, fourth feeder F4 completes related operation and transitions to the stopped state. Here, signal quantity N is reduced from three to two, so interlock release section 78 executes steps S5 and S6.

Interlock release section 78 of the first alternative embodiment memorizes a history of operating states of the multiple related operation devices (31, 91, 92, 93, 94). Here, it is assumed that the history of operating states is in the order from the oldest side of fourth feeder F4, fifth feeder F5, third feeder F3, sixth feeder F6, seventh feeder F7, eighth feeder F8, then fourth feeder F4 again. In step S5, interlock release section 78 determines a release target according to an order of newest history. That is, interlock release section 78 sets eighth feeder F8, which had been operating immediately before and has the most recent history except for fourth feeder F4 that was in the stopped state, and fifth feeder F5 and third feeder F3 that are in the operating state, as a release target. In step S6, interlock release section 78 cancels the interlock signal SI being output to eighth feeder F8.

If eighth feeder F8 does not immediately transition into the operating state, interlock release section 78 operates again in the subsequent fifth control cycle Cy5. That is, interlock release section 78 sets seventh feeder F7 that was operating immediately before eighth feeder F8 as the release target, and cancels the interlock signal SI. Further, in the subsequent sixth control cycle Cy6, interlock release section 78 operates again. That is, interlock release section 78 sets sixth feeder F6 that was operating immediately before seventh feeder F7 as the release target, and cancels the interlock signal SI.

Further, in seventh control cycle Cy7, interlock release section 78 sets first feeder F1, which is not in the history, as the next release target, and releases the interlock signal SI. Further, in eighth control cycle Cy8, interlock release section 78 sets second feeder F2, which is not in the history, as the next release target, and releases the interlock signal SI.

The first alternative embodiment is effective when there is a large difference in the operating quantity of the multiple feeder devices 31. In other words, in the first alternative embodiment, the interlock of a feeder device 31 that performs a large number of supply operations is preferentially released without acquiring information of the order of operating from mounting control section 6. Thus, when multiple components are continuously supplied from a particular feeder device 31, the waiting time for the carrier tape feeding operation can be reduced.

Figure 6:
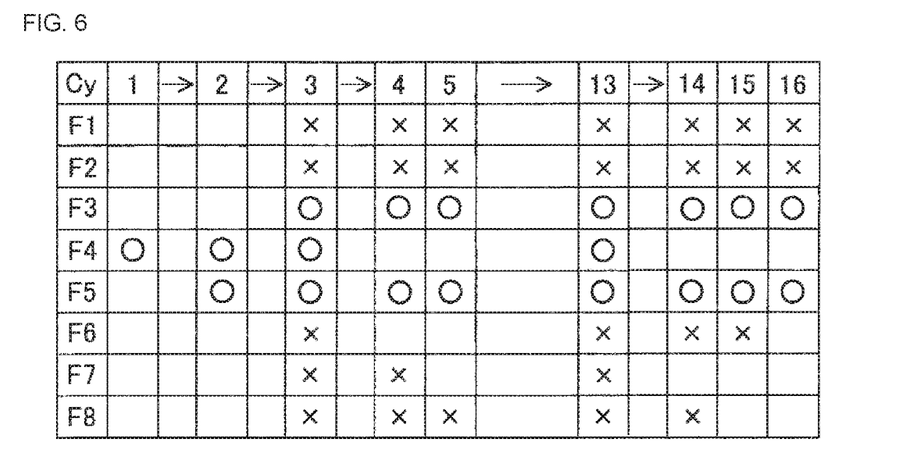
FIG. 6 is a diagram of a third example illustrating how control operation of the limiting device proceeds in a second alternative embodiment.

Next, in a second alternative embodiment, without changing the configuration shown in FIG. 1, limiting device 75 of the configuration shown in FIG. 2 is not connected to mounting control section 6. Limiting device 75 executes the control flow shown in FIG. 3. However, in step S5, the method of determining the release target by interlock release section 78 is modified. FIG. 6 is a diagram of a third example illustrating how control operation of limiting device 75 proceeds in a second alternative embodiment. The reference characters in FIG. 6 are the same as in FIG. 4. Also, events from first control cycle Cy1 to fifth control cycle Cy5 in FIG. 6 are the same as those in FIG. 4.

Interlock release section 78 of the second alternative embodiment holds information of an order associated in advance with the multiple related operation devices. For example, interlock release section 78 uses the slot numbers as the order information. In step S5, interlock release section 78 sets, as a release target for releasing the interlock signal this time, the related operation device in the stopped state corresponding to the one next in order to the related operation device from which the interlock signal SI was released last time.

To describe in detail, in fourth control cycle Cy4 of FIG. 6, fourth feeder F4 transitions to the stopped state, and the signal quantity N is reduced from three to two. Here, interlock release section 78 sets sixth feeder F6 in slot number six as the release target, and cancels the interlock signal SI. Then, when the signal quantity N is reduced from three to two in the subsequent fourteenth control cycle Cy14, interlock release section 78 intentionally changes the current release target. That is, interlock release section 78 sets seventh feeder F7 of slot number seven, which corresponds to the next in order following the slot number six for which the interlock signal SI was released last time, as the release target of the interlock signal SI this time.

Further, in a third alternative embodiment too, without changing the configuration shown in FIG. 1, limiting device 75 of the configuration shown in FIG. 2 is not connected to mounting control section 6. Limiting device 75 executes the control flow shown in FIG. 3. However, in step S5, the method of determining the release target by interlock release section 78 is modified. That is, interlock release section 78 according to the third alternative embodiment randomly determines a release target of the interlock signal SI from among the related operation devices that are in the stopped state. Interlock release section 78 randomly determines a release target using, for example, a random number generation function.

In the second alternative embodiment and the third alternative embodiment, it is possible to equalize the interlock release order among the multiple related operation devices without fixing the order. With conventional technology, the order of release of the interlock is fixedly determined based on the ascending order of the slot numbers or the like. Thus, for a related operation device at a position with a high slot number, there is a smaller chance of the interlock being released, or the timing of releasing the interlock is delayed, which results in unbalance. As a result, for example, problems occur such as operators who operate the operation panel 37 of feeder device 31 having to wait for a long time. According to the second alternative embodiment and the third alternative embodiment, the order of releasing the interlock of the multiple related operation devices can be equalized to solve these problems.

4. Component Mounting Machine of Second Embodiment

Figure 7:
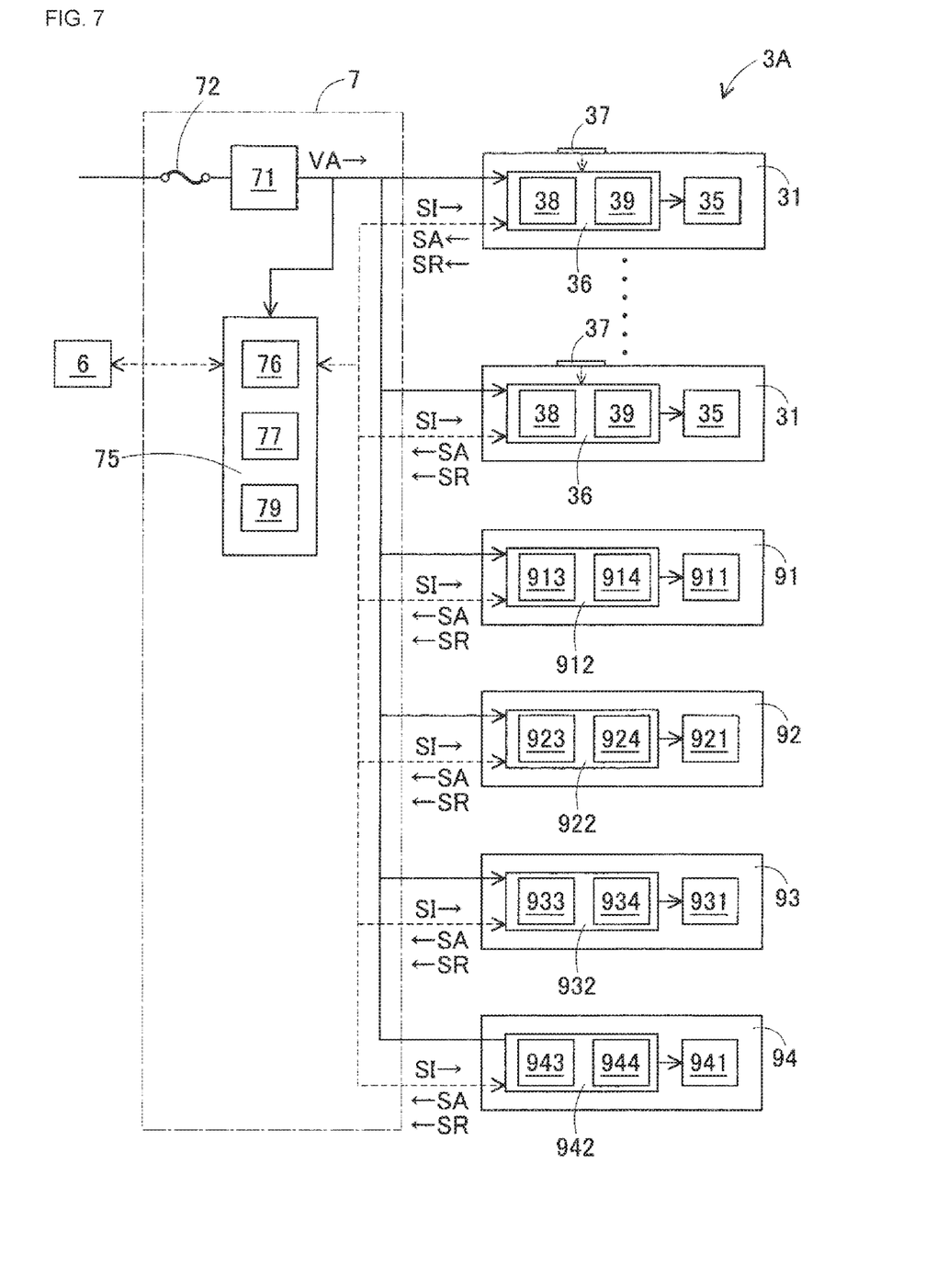
FIG. 7 is a block diagram schematically showing a configuration related to power supply and control of a component supply device according to a second embodiment.

Next, a component mounting machine of a second embodiment will be described with reference to FIG. 7, with mainly differences from the first embodiment and the alternative embodiments being described. FIG. 7 is a block diagram schematically showing a configuration related to power supply and control of component supply device 3A according to a second embodiment. As shown in FIG. 7, feeder control section 36 of feeder device 31 includes reservation output section 39. Reservation output section 39 outputs reservation signal SR to limiting device 75 when an operation request for transitioning to the operating state occurs while the interlock signal SI is being received in the stopped state. Reservation signal SR reserves a transition to the operating state.

Similarly, tray control section 912 of tray type pallet device 91 includes reservation output section 914. Sheet control section 922 of dicing sheet type pallet device 92 includes reservation output section 924. Dip control section 932 of dip device 93 includes reservation output section 934. Conveyor control section 942 of defective component collection device 94 includes reservation output section 944. Each reservation output section (914, 924, 934, 944), similar to reservation output section 39 of feeder device 31, outputs reservation signal SR to limiting device 75.

Also in the second embodiment, limiting device 75 executes the control flow shown in FIG. 3. However, in step S5, the method of determining the release target by interlock release section 79 is modified. That is, interlock release section 79 determines a release target of the interlock signal SI from among the related operation devices in the stopped state in accordance with the order in which the reservation signal SR is received. Accordingly, since the interlock of a related operation device for which an operation request has occurred can be released preferentially, redundancy is not introduced into the control.

5. Applications and Alternative Embodiments

Note that, in practice, the quantities involved would be larger than the eight feeder devices 31 and the specified quantity Na of three that are used as examples in the first embodiment. Further, in the first embodiment, all the related operation devices (31, 92, 92, 93, 94) are handled in the same manner, but exceptions may be provided. For example, a related operation device having a larger power consumption than others can be counted as two devices in the operating state, which can be reflected in the limit of the specified quantity Na. The first and second embodiments may be applied with various other applications and modifications.

REFERENCE SIGNS LIST

1: component mounting machine;
2: board conveyance device;
3, 3A: component supply device;
31: feeder device;
35: electrically-operated section;
36: feeder control section;
37: operation panel;
38: output section;
39: reservation output section;
4: component transfer device;
5: component camera
6: mounting control section;
7: device pallet;
71: power source device;
75: limiting device;
76: interlock transition section;
77: interlock output section;
78, 79: interlock release section;
91: tray type pallet device;
92: dicing sheet type pallet device;
93: dip device;
94: defective component collection device;
F1 to F8: first to eighth feeder;
SA: operation signal;
SI: interlock signal;
SR: reservation signal

The invention claimed is:

1. A component mounting machine configured to perform a mounting operation of mounting an electronic component to a board, the component mounting machine comprising:
multiple related operation devices each including an electrically-operated section configured to perform a related operation that is an operation related to the mounting operation, and an output section configured to output an operation signal representing a state of the electrically-operated section that is operating; and
circuitry configured to
count a signal quantity of the operation signals being output from all of the related operation devices,
compare the signal quantity of the operation signals to a predetermined value,
when the signal quantity of the operation signals is greater than or equal to the predetermined value, output an interlock signal to the related operation devices in a stopped state to prohibit the related operations in the stopped state from transition to an operating state, and
when the signal quantity of the operating signals is less than the predetermined value and the interlock signal is being output to the related operation devices in the stopped state, determine a release target among the related operation devices in the stopped state to which the interlock signal is being output, and cancel the interlock signal to the release target to allow the release target to transition to the operating state, wherein the related operation devices comprise
a feeder device configured to perform a supply operation of the electronic components using carder tape,
a pallet device configured to perform a supply operation of the electronic components using a pallet on which a tray or a dicing sheet is loaded,
a dip device configured to perform a supply operation of adhesive material or solder paste, and
a defective component collection device configured to perform a collection operation of collecting the electronic components that have been determined as defective.

2. The component mounting machine according to claim 1, wherein the circuitry is further configured to
acquire information of an order in which the multiple related operation devices will operate from a mounting control section configured to control the mounting operation, and
determine the release target for the interlock signal from the related operation devices that are in the stopped state, in accordance with the acquired order.

3. The component mounting machine according to claim 1, wherein the circuitry is further configured to
memorize a history of the operating states of the multiple related operation devices, and
determine the release target for the interlock signal from the related operation devices that are in the stopped state, in an order based on which is newest of the history of the operating states from among the related operation devices that are in the stopped state.

4. The component mounting machine according to claim 1, wherein the related operation device includes a reservation output section configured to output a reservation signal for reserving transition to the operating state in a case in which an operation request for transitioning to the operating state occurs while the interlock signal is being received in the stopped state, and
wherein the circuitry is further configured to determine the release target for the interlock signal from the related operation devices that are in the stopped state in accordance with an order in which the reservation signals are received.

5. The component mounting machine according to claim 1, wherein the circuitry is further configured to
hold information of an order associated in advance with the multiple related operation devices, and
determine, as a current release target for the interlock signal, the related operation device that is in the stopped state that is subsequent in the order to the related operation device for which the interlock signal was just previously canceled.

6. The component mounting machine according to claim 1, wherein the circuitry is further configured to determine the release target for the interlock signal at random from the related operation devices that are in the stopped state.

\* \* \* \* \*